US005674326A

United States Patent [19]
Wrezel et al.

[11] Patent Number: 5,674,326
[45] Date of Patent: Oct. 7, 1997

[54] SOLDER PASTE

[75] Inventors: James Alan Wrezel, Arlington Heights; William Rudolph Bratschun, LaGrange; John Laurence Leicht, Hawthorn Woods, all of Ill.

[73] Assignee: Motorola, Inc., Schaumburg, Ill.

[21] Appl. No.: 309,814

[22] Filed: Sep. 21, 1994

[51] Int. Cl.$^6$ .................................................. B23K 35/34
[52] U.S. Cl. ........................................... 148/24; 428/403
[58] Field of Search ................... 148/23–26, 24; 428/403

[56] References Cited

U.S. PATENT DOCUMENTS

| | | | |
|---|---|---|---|
| 2,923,649 | 2/1960 | Todd | 148/24 |
| 4,298,407 | 11/1981 | Taylor | 148/24 |
| 4,994,326 | 2/1991 | Shimmura et al. | 428/405 |
| 5,086,966 | 2/1992 | Melton et al. | 228/208 |
| 5,177,134 | 1/1993 | Mullen, III et al. | 524/284 |
| 5,328,521 | 7/1994 | Keusseyan | 148/22 |
| 5,328,522 | 7/1994 | Sowa et al. | 148/23 |
| 5,334,260 | 8/1994 | Stetanowski | 148/23 |

FOREIGN PATENT DOCUMENTS

| | | |
|---|---|---|
| 0 556 864 A1 | 8/1993 | European Pat. Off. . |
| 1-148488 A | 6/1989 | Japan . |
| 2-147194 A | 6/1990 | Japan . |
| 4-305393 A | 10/1992 | Japan . |
| 6-226487 A | 8/1994 | Japan . |

OTHER PUBLICATIONS

Dr. M. Warwick et al., "Solder Paste Design Considerations", *Circuits Assembly* magazine, Aug. 1994, pp. 36–42.

*Primary Examiner*—Melvyn Andrews
*Attorney, Agent, or Firm*—Donald C. Kordich

[57] ABSTRACT

Solder pastes presently harden or congeal over time. This results in wasted solder paste and in production down time. This hardening is a result of the long polymer chains created by the dicarboxylic acid in the activator and the indium (In) or tin (Sn). A solder paste is described in which the metal alloy is coated by an agent that inhibits the reaction with the dicarboxylic acid. One solution involves coating the metal alloy powder with monocarboxylic acids, which truncate the polymer chain. Another manner for truncating the polymer is to coat the metal alloy powder with complexing agents. The metal alloy powder can also be coated by a stable metal such as lead (Pb), gold (Au), silver (Ag), bismuth (Bi), palladium (pd), platinum (Pt), a silver palladium alloy (AgPd) or a silver platinum alloy (AgPt).

15 Claims, No Drawings

SOLDER PASTE

FIELD OF THE INVENTION

The present application relates to the field of solder paste and methods for making them, more specifically to a solder paste, and method, that extends the useful working life of solder pastes.

BACKGROUND OF THE INVENTION

Solder paste is used in producing printed circuit boards and joins components to the circuit board. The solder paste is deposited onto the circuit board by creating a screen, which allows the paste to be placed on the circuit board at very precise locations. The paste is placed on the screen and a squeegee moves the paste across the screen. The paste is pushed through small holes onto the appropriate positions.

Solder paste is made by combining metal powder with a vehicle system. The metal powder is made up of two or three metals that melt at low temperatures. Such metals include lead (Pb), tin (Sn), gold (Au), silver (Ag) and indium (In). The metal powder mixture is mixed with the vehicle system to form a paste. The percentage of metal powder in the paste usually varies from 85–95% by weight.

The vehicle system normally contains four components: an activator, a rosin or rosin derivative or a resin, a solvent and a rheology control agent. The activator removes oxidation from the metal solder pads of the circuit board and metal leads of the components and is temperature activated. The rosin or resin is used to add thickness and also protects the metals from oxidation during solder paste reflow. A rosin is a non-steam volatile fraction of pine sap. A resin is a synthetic or naturally occurring polymer. The solvent dissolves all of the other constituents of the vehicle system. Finally, the rheology control agent controls the viscosity of the paste as the paste is worked, sheared by the action of the squeegee. Ideally, the rheology control agent allows the paste to shear, demonstrating a reduction in viscosity, as the paste is moved about by the squeegee and allows the paste to thicken after deposition on the circuit board.

Presently, solder pastes have a tendency to harden or congeal over time. As the paste hardens, it eventually becomes unworkable. At this point the excess solder paste has to be discarded and the screening tools have to be cleaned of the congealed solder paste. This results in solder paste being wasted and down time for production lines. Because the solder paste congeals whether it is used or not, solder paste cannot be stored in large quantities and must constantly be re-supplied.

Thus, there exists a need for a solder paste, and method for producing the solder paste, which will not harden or congeal within the normal lifetime of the paste.

DESCRIPTION OF THE PREFERRED EMBODIMENTS

In order to prevent the congealing of solder paste, it is necessary to prevent the mechanism causing the solder paste to congeal. The presumed mechanism is the reaction of the indium (In), or possibly tin (Sn), with the dicarboxylic acid activators present in the solder paste. This reaction forms high molecular weight polycarboxylate salts or metal-coordinated dibasic acids. Essentially, the activators are converted to thermoplastic or adhesive materials which congeal the paste. The chemical chain has the following formula:

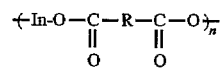

Where R is some $C_mH_n$ alkyl chain, where m is any number up to 20 and n is any number up to 40.

The solution is to provide a chemical that inhibits the metal alloy powder from binding with the dicarboxylic acid, but does not interfere with the solder paste process. Coating the metal alloy particles with a monocarboxylic acid would truncate the chain since only one carboxyl (COOH) group is available to bind with the (In) indium, or (Sn) tin. Acids with a low pKa are considered preferable, since they react readily with (In) indium and (Sn) tin and form stable coatings.

A second method of inhibiting the dicarboxylic acid's reaction with the metal alloys is to coat the metal alloy particles with complexing agents. A complexing agent forms chelate rings encompassing the metal alloy and prevents it from reacting with the dicarboxylic acid. It is important that the complexing agent not interfere with solder paste chemistry. Some complexing agents are benzotriazole, 2,4-pentanedione, 8-hydroxyquinoline, or alkylimidizole, such as 2-methylimidazole.

A third method of inhibiting the dicarboxylic acid's reaction with the metal alloy powder is to coat the highly reactive metal alloy powder, containing (In) indium and possibly (Sn) tin, with less reactive metals. These less reactive metals would have to be good soldering metals and be readily alloyed with (In) indium or (Sn) tin solders and not adversely affect the solder's properties, such as melting temperature. Some good examples are (Pb) lead, (Ag) silver, (Bi) bismuth, (Pd) palladium, (Pt) platinum, (AgPd) a silver palladium alloy and (AgPt) a silver platinum alloy. Gold (Au) could also be used but may contribute to solder alloy embrittlement due to its known tendency to form embrittling intermetallic compounds. Very thin coatings, in the millionths of an inch thickness range, will be sufficient. Techniques such as vapor deposition or immersion plating may be used.

EXAMPLES

Four solder paste samples were tested. All are blended from the same rosin-based flux. All contain the same metal alloy powder: 40In-40Sn-20Pb, 86%, which means the metal alloy powder is 86% by weight of the solder paste. The only difference in the four solder paste samples was the metal alloy powder pretreatment. Sample one was pretreated with propionic acid ($CH_3$—$CH_2$—COOH); Sample two was pretreated with lauric acid ($CH_3$—$[CH_2]_{10}$—COOH); Sample three was pretreated with benzoic acid ($C_6H_5$—COOH), which is an aromatic monocarboxylic acid; Sample four was not pretreated.

In order to form a coating the acids were dissolved in a solvent, ether in this case. The metal alloy was then immersed in the solution. After draining off the excess solution of the appropriate acid, the metal alloy powder conditioned overnight in an 60° C. oven. The resulting coating was estimated to be approximately 100 "molecular layers" in thickness.

Another method could be used to deposit the acids onto the metal alloy powder. For example, the metal alloy powder could be spread out onto a large surface. The acid solution is atomized onto the powder. Finally, the metal alloy powder is dried.

All four samples were tested in stencil print applications to determine their time to failure during use. Failure is defined as inability to produce a properly deposited print onto an epoxy glass laminate with copper metal soldering pads.

The printing test was conducted on a DEK 249 printer, equipped with a dual blade squeegee, hard delrin squeegee blades, stainless steel stencil, 0.006 in thick, with an array pattern of 0.020 in diameter holes. Print speed of the squeegee was 16 mm/sec. Sample four, having no pretreatment was the control. The results are presented below.

| SAMPLE | TIME ON PRINTER | | NO. OF PRINTS | PRETREAT OF POWDER |
|---|---|---|---|---|
| | DAYS | HOURS | | |
| #1 | 6.5 | 44 | 465 | Propionic acid |
| #2 | 5.5 | 33 | 265 | Lauric acid |
| #3 | 9.5 | 63 | 585 | Benzoic acid |
| #4 | 1.5 | 10 | 142 | None |

The test procedure was performed as follows: (1) Remove the paste from the refrigerator at the start of the day and bring it to room temperature; (2) Once the paste has reached room temperature (approximately 1 hr.), print 15 times with the paste; (3) One to one and half hours later, print 15 times with the paste; (4) Repeat step three until the end of the work day (1 day); (5) At the end of the day place the unused paste back into its container, affix the cover, and store it in the refrigerator until the next day of the test.

As can be seen from the results table, pretreating the metal alloy powder significantly increased the useful life of the solder paste.

In summary, the present invention provides a means for extending the useful life of solder pastes. With this new solder paste, production time is not lost scrapping off hardened solder paste and cleaning the associated equipment. It also reduces the waste that occurs when the hardened solder paste has to be thrown away.

What is claimed is:

1. A solder paste comprising:
   a flux containing dicarboxylic acid that serves as an activator;
   a metal alloy powder including a plurality of metal alloy particles; and
   an inhibiting agent, coating the plurality of metal alloy particles, for inhibiting the metal alloy particles from binding with the dicarboxylic acid.

2. The solder paste of claim 1 wherein the inhibiting agent is a metal-complexing agent.

3. The solder paste of claim 2, wherein the metal-complexing agent is benzotriazole, 2,4-pentanedione, 8-hydroxyquinoline, or 2-methylimidazole.

4. The solder paste of claim 1 wherein the inhibiting agent is a monocarboxylic acid.

5. The solder paste of claim 4, wherein the monocarboxylic acid has at least 1 and up to 20 carbon atoms.

6. The solder paste of claim 1, wherein the coating thickness range from at least 1 up to 100 molecular layers.

7. The solder paste of claim 1 wherein the inhibiting agent is Pb, Au, Ag, Bi, Pd, Pt, AgPd or AgPt.

8. The solder paste of claim 1, wherein the flux further includes a rosin, rosin derivative, or resin.

9. The solder paste of claim 1, wherein the plurality of metal alloy particles contains tin.

10. The solder paste of claim 1, wherein the inhibiting agent is an aromatic monocarboxylic acid.

11. The solder paste of claim 1, wherein the inhibiting agent is a monocarboxylic acid selected from the group consisting of propionic acid, lauric acid and benzoic acid.

12. The solder paste of claim 1, wherein the plurality of metal alloy particles contains indium.

13. A metal alloy powder for combining with a flux containing dicarboxylic acid to form a solder paste, the metal alloy powder comprising:
   a plurality of indium alloy particles; and
   a monocarboxylic acid coating the plurality of indium alloy particles.

14. The metal alloy powder of claim 13, wherein the monocarboxylic acid is selected from the group consisting of propionic acid, lauric acid and benzoic acid.

15. A solder paste comprising:
   a flux; and
   an indium alloy powder coated with a monocarboxylic acid.

* * * * *